(12) United States Patent
Lin et al.

(10) Patent No.: US 11,054,592 B2
(45) Date of Patent: Jul. 6, 2021

(54) HEATSINK WITH GRAPHENE COATING AND AN OPTICAL TRANSMITTER OR TRANSCEIVER IMPLEMENTING SAME

(71) Applicant: Applied Optoelectronics, Inc., Sugar Land, TX (US)

(72) Inventors: Kai-Sheng Lin, Sugar Land, TX (US); Hao-Chiang Cheng, Houston, TX (US); Ziliang Cai, Richmond, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 16/693,361

(22) Filed: Nov. 24, 2019

(65) Prior Publication Data
US 2021/0157074 A1 May 27, 2021

(51) Int. Cl.
*G02B 6/42* (2006.01)
*H05K 7/20* (2006.01)
*F21V 8/00* (2006.01)

(52) U.S. Cl.
CPC ......... *G02B 6/4269* (2013.01); *G02B 6/0085* (2013.01); *H05K 7/209* (2013.01); *H05K 7/20409* (2013.01)

(58) Field of Classification Search
None
See application file for complete search history.

(56) References Cited

U.S. PATENT DOCUMENTS

| 5,202,943 A * | 4/1993 | Carden ............... | G02B 6/4246 |
| | | | 385/92 |
| 10,128,627 B1 * | 11/2018 | Kazav ................. | G02B 6/4269 |
| 2003/0161593 A1 * | 8/2003 | Stackhouse ......... | G02B 6/4204 |
| | | | 385/92 |
| 2015/0257308 A1 * | 9/2015 | Li ...................... | H05K 7/20427 |
| | | | 361/706 |

(Continued)

FOREIGN PATENT DOCUMENTS

KR 101742386 B1 * 6/2017

OTHER PUBLICATIONS

Nering, Ray, Cisco Demonstrates 20W+ Power Dissipation of QSFP-DD at OFC 2019, Cisco Blogs, SP360: Service Provider, 2019, 1 pg.

(Continued)

*Primary Examiner* — Chad H Smith
(74) *Attorney, Agent, or Firm* — Grossman Tucker Perreault & Pfleger, PLLC; Norman S. Kinsella

(57) ABSTRACT

The present disclosure is generally directed to a housing for use with optical transceivers or transmitters that includes integrated heatsinks with a graphene coating to increase thermal dissipation during operation. In more detail, an embodiment of the present disclosures includes a housing that defines at least first and second sidewalls and a cavity disposed therebetween. The first and/or second sidewalls can include integrated heatsinks to dissipate heat generated by optical components, e.g., laser diodes, laser diode drivers, within the cavity of the housing. The integrated heatsinks (Continued)

can include at least one layer of graphene disposed thereon to increase thermal performance, and in particular, to decrease thermal resistance of the heatsink and promote heat dissipation.

15 Claims, 3 Drawing Sheets

(56) References Cited

U.S. PATENT DOCUMENTS

2019/0249940 A1* 8/2019 Que .................... H01L 23/3731

OTHER PUBLICATIONS

Nowell, Mark: Cisco, "QSFP-DD: Enabling 15 Watt Cooling Solutions", White Paper, Mar. 12, 2018, 20 pgs.
Hall, Thomas A., III, "Thermal Design of QSFP-DD Cages and Heatsinks for High Power, High Density Applications", Samtec Inc., Application Note, Mar. 2018, 25 pgs.
Perry, Josh, "What are the benefits of using Pin Fin Heat Sinks in thermal management of electronics", ATS Advanced Thermal Solutions, Inc., Aug. 22, 2017, 1 pg.

* cited by examiner

"HEATSINK WITH GRAPHENE COATING AND AN OPTICAL TRANSMITTER OR TRANSCEIVER IMPLEMENTING SAME"

TECHNICAL FIELD

The present disclosure relates to optical communications, and more particularly, to techniques for increasing thermal performance of optical transmitters or transceivers using housings with integrated heatsinks and graphene-based coatings.

BACKGROUND INFORMATION

Optical transceivers are used to transmit and receive optical signals for various applications including, without limitation, internet data center, cable TV broadband, and fiber to the home (FTTH) applications. Optical transceivers provide higher speeds and bandwidth over longer distances, for example, as compared to transmission over copper cables. The desire to provide higher transmit/receive speeds in increasingly space-constrained optical transceiver modules has presented challenges, for example, with respect to thermal management, insertion loss, RF driving signal quality and manufacturing yield.

The data center market for optical transceivers continues to grow, as well as increased demand in ever-increasing transmission speeds. Recent standards have now enabled wide-spread development of optical transmitters and transceivers capable of reaching speeds of 400 Gb/s. Thermal management within such high-speed systems raises numerous, non-trivial challenges.

BRIEF DESCRIPTION OF THE DRAWINGS

These and other features and advantages will be better understood by reading the following detailed description, taken together with the drawings wherein.

DETAILED DESCRIPTION

The present disclosure is generally directed to a housing for use with optical transceivers or transmitters that includes integrated heatsinks with a graphene coating to increase thermal dissipation during operation. In more detail, an embodiment of the present disclosures includes a housing that defines at least first and second sidewalls and a cavity disposed therebetween. The first and/or second sidewalls can include integrated heatsinks to dissipate heat generated by optical components, e.g., laser diodes, laser diode drivers, within the cavity of the housing. The integrated heatsinks can include at least one layer of graphene disposed thereon to increase thermal performance, and in particular, to decrease thermal resistance of the heatsink and promote heat dissipation.

A transceiver/transmitter housing configured consistent with the present disclosure can advantageously dissipate heat generated by high-wattage laser devices in high-speed transmission systems, such as those operating at 20 W and greater. Load on temperature control devices, e.g., e.g., thermoelectric coolers (TECs), can be significantly reduced to ensure overall power consumption remains below prescribed standards, e.g., at or below 14 Watts as required by the "QSFP-DD MSA QSFP-DD Hardware Specification for QSFP DOUBLE DENSITY 8× PLUGGABLE TRANSCEIVER Rev 5.0" (hereinafter QSFP-DD standard) published on Jul. 9, 2019.

Figure 1:
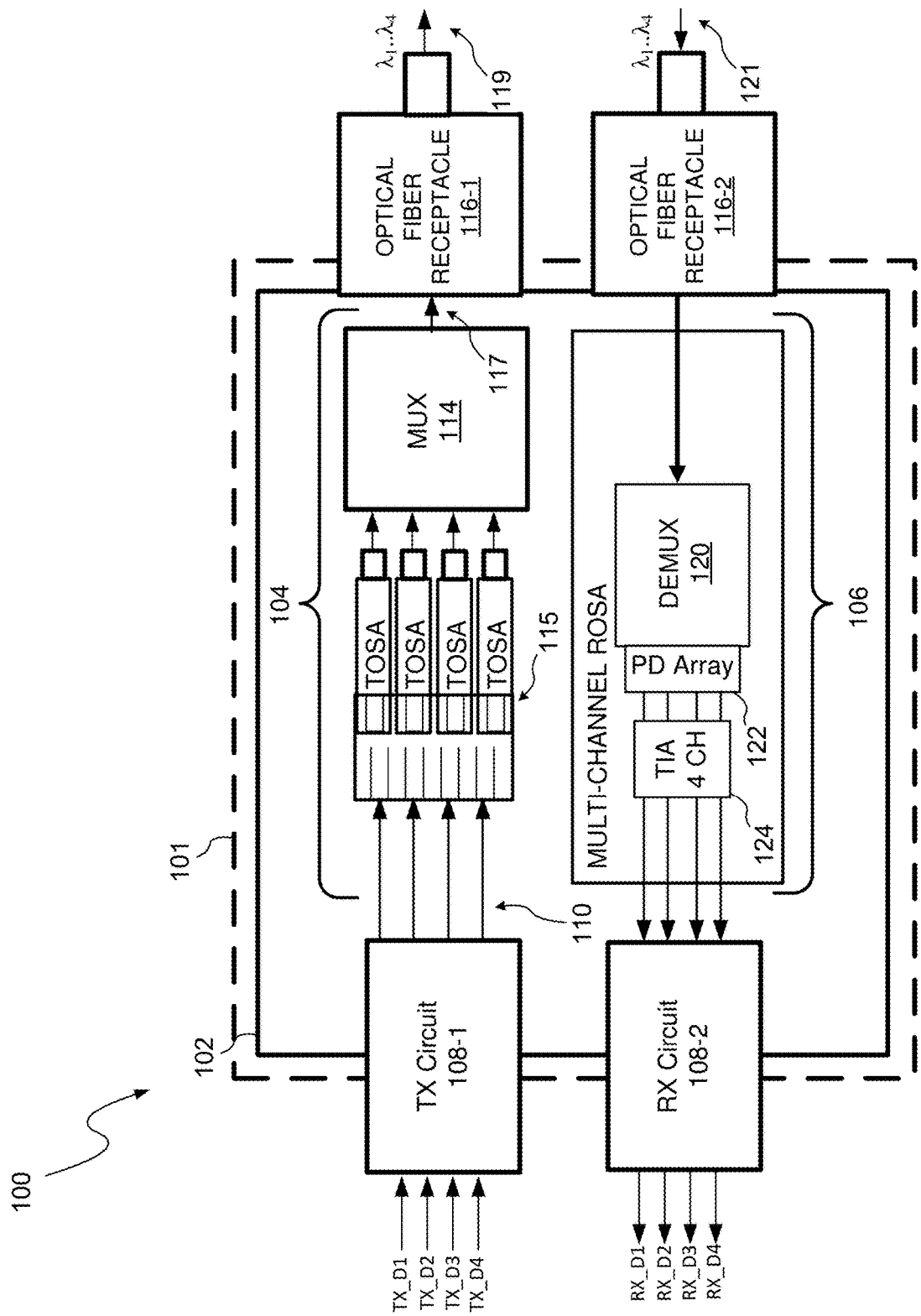
FIG. 1 is a schematic view of an example optical transceiver system consistent with embodiments of the present disclosure.

FIG. 1 shows a block diagram of a multi-channel optical transceiver module 100 consistent with embodiments of the present disclosure. The optical transceiver module 100 includes a housing 101, a substrate 102, a transmitter optical subassembly (TOSA) arrangement 104, a receiver optical subassembly (ROSA) arrangement 106. The housing 101 can comport with various enclosure standards, and preferably the QSFP-DD standard. The housing 101 can include integrated heatsinks with one or more of graphene disposed thereon, as discussed further below, to increase dissipation of heat conducted/radiated from optical components within the housing 101.

The multi-channel optical transceiver module 100 can transmit and receive at, for instance, 400 Gb/s. The multi-channel optical transceiver module 100 can implement an electrical side of eight (8) lanes of 53.125 Gbps PAM. On the other hand, the optical side can implement four (4) to eight (8) channels while operating on, for instance, LWDM wavelengths at 1273-1309, or CWDM wavelengths at 1271-1331 nm, although other wavelengths are within the scope of this disclosure. The optical transceiver module 100 is capable of transmission distances of up to 10 kilometers, and beyond, depending on a an intended application.

The substrate 102 includes a transmit (TX) connecting circuit 108-1 and a receiver (RX) connecting circuit 108-2. The TX connecting circuit 108-1 and RX connecting circuit 108-1 include a plurality of leads printed/disposed on first end of the substrate 102 and can also include additional circuitry such as power converters, rectifiers, and so on. The first end of the substrate 102 at least partially extends from the housing 101 to allow for external circuitry to electrically couple to the TX connecting circuit 108-1 and RX connecting circuit 108-2.

The substrate 102 further includes TX traces 110 with a first end coupled to the TX connecting circuit 108-1 and a second end electrically coupled to the TOSA arrangement 104. The TOSA arrangement can include a plurality of laser arrangements 115 (or TOSAs). Each laser arrangement of the plurality of laser arrangements 115 includes passive and/or active components such as a laser diode, monitor photodiode, laser diode driving (LDD) chip, optical isolator, and/or focus lens. The optical multiplexer 114 includes input ports to receive channel wavelengths from the TOSA arrangement 104 and an output port to output a multiplexed optical signal 117 having each of the received channel wavelengths. The multiplexed optical signal 117 gets launched on an external TX optical fiber by way of optical fiber receptacle 116-1. The optical multiplexer 114 comprises an arrayed waveguide grating (AWG), although this disclosure is not intended to be limited in this regard. In addition, the optical multiplexer 114 may not necessarily be included within the housing 101 depending on a desired configuration.

In operation, the TX connecting circuitry 108-1 provides driving signals (D1-D4) to drive the TOSA arrangement 104, e.g., from external driving circuitry. The TOSA arrangement 104 then receives the driving signals (D1-D4), e.g., via traces 110, and modulates the plurality of TOSAs 115 to convert output four different output optical signals ($\lambda 1$-$\lambda 4$). The optical multiplexer 114 then combines the output optical signals into a multiplexed optical signal 117. The multiplexed optical signal 117 then launches on to the transmit optical fiber 119 by way of the optical fiber receptacle 116-1. Note that while the embodiment of FIG. 1 shows a four (4) channel system, other channel configurations are also within the scope of this disclosure.

The RX connecting circuit 108-2 includes a plurality of traces to electrically couple the multi-channel ROSA arrangement 106 to external receiver circuitry. The multi-channel ROSA arrangement includes an optical demultiplexer 120, a photodiode (PD) array 122, and a transimpedance amplifier 124.

The optical demultiplexer 120 comprises, for example, an arrayed waveguide grating (AWG) or other suitable device. An input of the optical demultiplexer 120 is optically coupled to the RX optical fiber 121 to receive an RX optical signal having a plurality of channel wavelengths. An output end of the optical demultiplexer 120 outputs separated channel wavelengths on to corresponding photodetectors of the PD array 122. The PD array 122 outputs electrical signals proportional to detected wavelengths. Transimpedance amplifier 124 includes circuitry to amplify and filter signals from the PD array 122.

Figure 2:
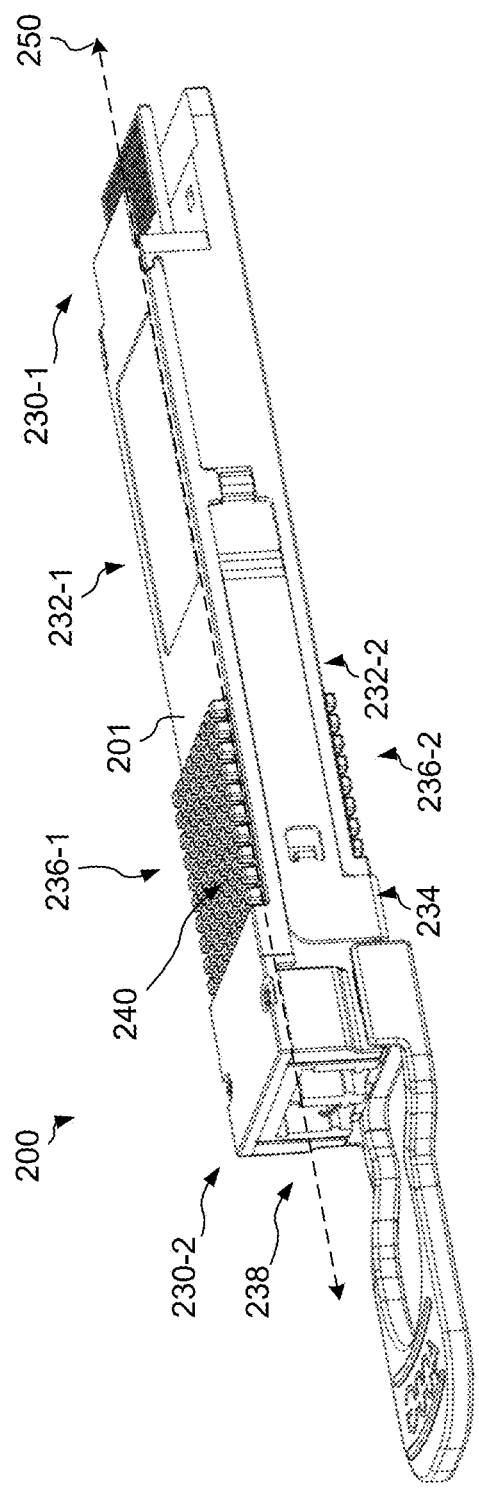
FIG. 2 is a perspective view of a pluggable optical transceiver module implementing the example optical transceiver system of FIG. 1 in accordance with an embodiment of the present disclosure.

FIG. 2 shows an example pluggable optical transceiver module 200 (referred to herein as simply a transceiver module) consistent with the present disclosure. The example transceiver module 200 implements the multi-channel optical transceiver module 100 of FIG. 1 in a pluggable form factor, and in particular a QSFP-DD form factor capable of transmission rates up to 400 Gbp/s, although other form factors are within the scope of this disclosure. Although aspects and embodiments disclosed herein specifically reference a transceiver module, this disclosure is not limited in this regard. For instance, a housing with heatsinks configured consistent with the present disclosure may be utilized for other types of optical devices including, for example, optical transmitters.

The example transceiver module 200 includes a housing 201 that includes at least first and second sidewalls 231-1, 231-2 which extend from a first end 230-1 to a second end 230-2 of the housing 201 along a longitudinal axis 250. As shown, sidewalls with a locking arrangement 234 adjoin the first and second sidewalls 231-1, 231-2. Thus, the housing 201 can include a pluggable configuration whereby the housing 201 can be removably coupled into a cage (not shown).

The first end 230-1 of the housing 201 includes circuitry to electrically couple to external transmit and receive circuitry and may also be referred to herein as an electrical coupling end. The second end 230-2 of the housing 201 includes optical receptacles 238 to receive, for example, ferrules, to optically couple with transmit and receive fiber (s). The second end 230-2 may also be referred to as an optical coupling end.

As further shown, the first and second sidewalls 231-1, 231-2 further include first and second heatsinks 236-1, 236-2 respectively. The first and second heatsinks 236-1, 236-2 are disposed opposite each other, and are each adjacent the optical coupling end 230-2. The first and second heatsinks 236-1, 236-2 can be configured to increase heat dissipation during operation of the optical transceiver module 200, as discussed in detail further below.

Each of the first and second heatsinks 236-1, 236-2 include a so-called "pin" configuration whereby each heatsink provides a plurality of protrusions arranged in an M×N array. Pin-type heatsinks are particularly well suited for optical transceiver housings as the same allow for ambiguous airflow in multiple directions. For example, airflow within and around transceiver cages tends to vary depending on, for instance, fan placement and airflow (e.g., cubic feet per minute), housing designs, rack density, and so on. Pin-type heatsinks, such as shown, provide cross-cut channels 240 that extend across the heatsinks and permit so-called "ambiguous" airflow whereby air that circulates around the optical transceiver module 200 can enter the cross-cut channels and flow there-through from a plurality of different directions.

As shown, the first and second heatsinks 236-1, 236-2 include rectangular projections with an aspect ratio of about 1:1, e.g., height versus width. The projections forming each of the first and second heatsinks 236-1, 236-2, can extend from edge-to-edge across the minor axis of the housing 201 to maximum surface area. The projections extend from the first and second surfaces 232-1, 232-2 to a predefined height. One non-limiting example predefined height includes, for instance, 0.5-2 mm.

Note, other types of heatsinks are also within the scope of this disclosure such as fin-type heatsinks. In addition, the first and second sidewalls 231-1, 231-2, may not necessarily include protrusions/fins, and instead, may be provided simply by the substantially flat surface defining each sidewall.

Each of the first and second heatsinks 236-1, 236-2 may be integrally formed with respective sidewalls as a single, monolithic piece. The heatsinks 236-1, 236-2 can comprise Aluminum, for example, or any other material with high thermal conductivity, e.g., at least 205 W/m*K, to provide low thermal resistance.

Figure 3:
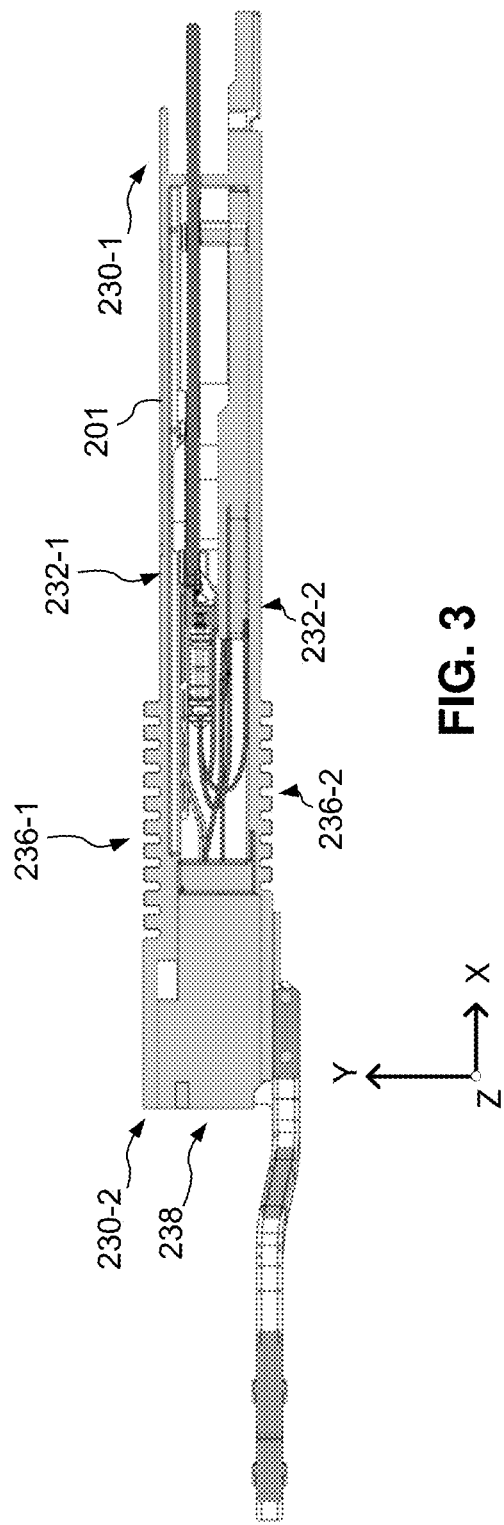
FIG. 3 shows a cross-sectional view of the pluggable optical transceiver module of FIG. 2 in accordance with an embodiment of the present disclosure.

Turning to FIG. 3, a cross-sectional view of the optical transceiver module 200 is shown in accordance with an embodiment. As shown, the first and second heatsinks 236-1, 236-2 are integrally formed as a single piece with the sidewalls 236-1, 236-2, respectively. This configuration may also be referred to as an opposing orientation whereby each of the first and second heatsinks 236-1, 236-2 are disposed opposite each other. As shown, at least one axis drawn perpendicular to the longitudinal axis intersects with both the first and second heatsinks 236-1, 236-2. The opposing arrangement of the first and second heatsinks 236-1, 236-2 allows for increased thermal communication substantially along the X and Z axis to draw and dissipate heat away from the heat-generating transceiver components, e.g., laser diodes, laser diode drivers, and so on.

Continuing on, in and in accordance with an embodiment, at least a portion of the first and/or second heatsinks 236-1, 236-2 include one or more layers of graphene disposed thereon. The at least one layer of graphene can comprise, for example, 50-100% graphene by weight %, and preferably 99-100% graphene.

Figure 4:
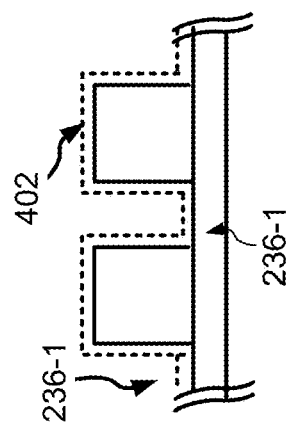
FIG. 4 shows an enlarged view of the pluggable optical transceiver module of FIG. 3 in accordance with an embodiment.

For example, FIG. 4 shows an enlarged portion of the first heatsink 236-1 with exaggerated dimensions. At least one layer of graphene 402 is disposed thereon, and preferably, two or more layers of graphene. The at least one layer of graphene 402 may be disposed uniformly across the first heatsink 236-1, or in a substantially uniform manner to ensure a constant layer thickness. The at least one layer of graphene 402 may be disposed or grown. Deposition of the at least one layers of graphene 402 can be selective (e.g., via masking), or in a blanket manner.

In an embodiment, the at least one layer of graphene 402 may also be disposed on the surface defining the first and and/or second sidewalls 236-1, 236-2 adjacent the first and second heatsinks 236-1, 236-2 (not shown). Thus, the first and/or second sidewalls 236-1, 236-2 can also include a graphene coating to increase thermal communication and heat dissipation. As discussed above, the first and second sidewalls 236-1, 236-2, may not necessarily include projections/protrusions to provide heatsinks and may simply include substantially flat surfaces. In this instance, selective and/or blanket deposition of one or more graphene layers on the surfaces defining the first and/or second sidewalls 236-1, 236-2 (including any other sidewalls adjoining the first and second sidewalls 236-1, 236-2) can significantly increase heat dissipation relative to sidewalls without graphene coating.

As further shown in FIG. 4, the at least one layer of graphene 402 can include in sections that extend along the X, Y and Z axis, e.g., based on the profile of the protrusions that form the associated heatsink. Accordingly, the embodiment of FIG. 4 provides graphene-coated cross-cut channels 240 (See FIG. 2). Graphene is particularly well suited for transferring heat in a horizontal fashion whereby heat conducts along the profile of the material layer, e.g., as opposed to vertically away from the material. The at least one layer of graphene 402 advantageously utilizes this thermal behavior to draw and dissipate heat received from the sidewall 236-1 through the layer, and importantly, provides a relatively large surface area by virtue of the geometry of the protrusions forming the associated heatsink. Further, the at least one layer of graphene 402 includes sections that extend along each of the X, Y and Z axis. The at least one layer of graphene 402 thus occupies and extends along multiple horizontal and vertical planes to maximize communication of heat away from the optical transceiver module 200.

In operation, heat generated by the optical components within the housing 201 gets communicated (e.g., via conduction) to the sidewalls 232-1, 232-2. The first and second heatsinks 236-1, 236-2 then provide, in a general sense, a rapid cooling region with a temperature delta of at least 10 degrees Celsius relative to the housing cavity based on the profile of the heatsinks (e.g., shape, material composition, dimensions) and/or a graphene coating. Air currents, e.g., ambiguous air currents within a rack, can enter through the graphene-coated cross-cut channels 240 (see FIG. 2 above) in various directions and further increase heat dissipation.

Thus, the present disclosure has identified that graphene-coated cross-cut channels increase thermal performance based on graphene having a relatively high thermal conductivity and radiation emissivity. Graphene coatings also can be applied in scenarios, such as small form-factor, that include relatively space-constrained housings. Such coatings can be applied to surfaces, e.g., such as heatsinks and/or sidewalls, without substantially altering the profile/width of the housing.

In accordance with an aspect of the present disclosure an optical device capable of transmitting multiple channel wavelengths is disclosed. The optical device comprising a housing having at least first and second sidewalls that extend from an electrical coupling end to an optical coupling end and define a cavity therebetween, an optical component disposed within the housing, the optical component in thermal communication with the housing to communicate generated heat, at least a first heatsink disposed on the first sidewall of the housing, and at least one layer of graphene disposed on the first heatsink, the at least one layer of graphene to increase thermal dissipation of heat generated by the optical component.

In accordance with another aspect of the present disclosure an optical transceiver capable of transmitting multiple channel wavelengths is disclosed. The optical transceiver comprising a housing having at least first and second sidewalls that extend from an electrical coupling end to an optical coupling end and define a cavity therebetween, a multi-channel transmitter optical subassembly (TOSA) disposed within the cavity of the housing, the multi-channel TOSA in thermal communication with the housing to dissipate generated heat, at least a first heatsink disposed on the first sidewall of the housing, and at least one layer of graphene disposed on the first heatsink, the at least one layer of graphene to increase thermal dissipation of heat generated by the multi-channel TOSA, and a multi-channel receiver subassembly (ROSA) disposed in the cavity of the housing.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. An optical device capable of transmitting multiple channel wavelengths, the optical device comprising:
    a housing having at least first and second sidewalls that extend from an electrical coupling end to an optical coupling end and define a cavity therebetween;
    an optical component disposed within the housing, the optical component in thermal communication with the housing to communicate generated heat;
    at least a first heatsink disposed on the first sidewall of the housing;
    at least one layer of graphene disposed on the first heatsink, the at least one layer of graphene comprising 50-100% graphene by weight % to increase thermal dissipation of heat generated by the optical component; and
    wherein the at least one layer of graphene provides graphene-coated channels that extend through the first heatsink to allow air currents to enter therein and dissipate heat generated by the optical component.

2. The optical device of claim 1, wherein the first heatsink includes a plurality of projections that extend from a surface defining the first sidewall.

3. The optical device of claim 2, wherein the at least one layer of graphene is disposed on the plurality of projections.

4. The optical device of claim 1, wherein the first heatsink includes a plurality of cross-cut channels to allow for airflow to enter the first heatsink from multiple directions.

5. The optical device of claim 1, wherein the at least one layer of graphene is also disposed on a substantially flat surface adjacent the first heatsink that defines the first sidewall.

6. The optical device of claim 1, wherein the first heatsink is disposed adjacent the optical coupling end of the housing.

7. The optical device of claim 1, further comprising:
    a second heatsink disposed on the second sidewall; and at least a second layer of graphene disposed on the second heatsink and/or a substantially flat surface of the second sidewall.

8. The optical device of claim 1, wherein the first heatsink is integrally formed with the first sidewall as a single piece.

9. The optical device of claim 1 implemented as a quad form-factor pluggable (QSFP) transceiver capable of sending and receiving at 400 gigabits per second.

10. An optical transceiver capable of transmitting multiple channel wavelengths, the optical transceiver comprising:
    a housing having at least first and second sidewalls that extend from an electrical coupling end to an optical coupling end and define a cavity therebetween;
    a multi-channel transmitter optical subassembly (TOSA) disposed within the cavity of the housing, the multi-channel TOSA in thermal communication with the housing to dissipate generated heat;
    at least a first heatsink disposed on the first sidewall of the housing; and
    at least one layer of graphene disposed on the first heatsink, the at least one layer of graphene comprising 50-100% graphene by weight % to increase thermal dissipation of heat generated by the multi-channel TOSA;
    wherein the at least one layer of graphene provides graphene-coated channels that extend through the first heatsink to allow air currents to enter therein and dissipate heat generated by the multi-channel TOSA; and
    a multi-channel receiver subassembly (ROSA) disposed in the cavity of the housing.

11. The optical transceiver of claim 10, wherein the first heatsink includes a pin-type heatsink whereby a plurality of projections extend from a surface defining the first sidewall.

12. The optical transceiver of claim 11, wherein the at least one layer of graphene is disposed on the plurality of projections.

13. The optical transceiver of claim 10, wherein the first heatsink includes a plurality of cross-cut channels to allow for air to enter from multiple directions, the plurality of cross-cut channels including at least one channel extending substantially transverse to a longitudinal axis of the housing and at least one channel extending substantially parallel with the longitudinal axis of the housing.

14. The optical transceiver of claim 10, wherein the at least one layer of graphene is also disposed on a substantially flat surface adjacent the first heatsink that defines the first sidewall.

15. The optical device of claim 7, further comprising one or more layers of graphene disposed on at least one sidewall that adjoins the first and second sidewalls.

* * * * *